United States Patent
Manakli et al.

(10) Patent No.: US 9,891,519 B2
(45) Date of Patent: Feb. 13, 2018

(54) FREE FORM FRACTURING METHOD FOR ELECTRONIC OR OPTICAL LITHOGRAPHY USING RESIST THRESHOLD CONTROL

(71) Applicant: ASELTA NANOGRAPHICS, Grenoble (FR)

(72) Inventors: Serdar Manakli, Meyrie (FR); Luc Martin, Saint-Martin-le-Vinoux (FR)

(73) Assignee: Aselta Nanographics, Grenoble (FR)

(*) Notice: Subject to any disclaimer, the term of this patent is extended or adjusted under 35 U.S.C. 154(b) by 0 days.

(21) Appl. No.: 15/033,016

(22) PCT Filed: Oct. 27, 2014

(86) PCT No.: PCT/EP2014/072948
§ 371 (c)(1),
(2) Date: Apr. 28, 2016

(87) PCT Pub. No.: WO2015/063006
PCT Pub. Date: May 7, 2015

(65) Prior Publication Data
US 2016/0252807 A1    Sep. 1, 2016

(30) Foreign Application Priority Data
Oct. 30, 2013   (EP) ..................................... 13306483

(51) Int. Cl.
*G06F 17/50*   (2006.01)
*G03F 1/70*    (2012.01)
(Continued)

(52) U.S. Cl.
CPC .................. *G03F 1/70* (2013.01); *G03F 1/68* (2013.01); *G03F 7/70433* (2013.01);
(Continued)

(58) Field of Classification Search
USPC ..................................................... 716/102, 55
See application file for complete search history.

(56) References Cited

U.S. PATENT DOCUMENTS

| 8,057,970 B2 | 11/2011 | Fujimura et al. |
| 2010/0055587 A1 | 3/2010 | Fujimura et al. |

(Continued)

FOREIGN PATENT DOCUMENTS

| EP | 2 302 659 A2 | 3/2011 |
| JP | H08-55771 A | 2/1996 |

OTHER PUBLICATIONS

A. Fujimura et al., "Model-Based Mask Data Preparation (MB-MDP) and its impact on resist heating," Proceedings of SPIE, vol. 7970, 2011, pp. 797012-1-797012-10, XP040556701.

*Primary Examiner* — Mohammed Alam
(74) *Attorney, Agent, or Firm* — Baker Hostetler LLP

(57) ABSTRACT

A computer implemented method of fracturing free form target design into elementary shots for defined roughness of the contour comprises determining a first set of shots which pave the target design and determining a second set of shots to fill the gaps. The dose levels of overlapping shots in the first or second sets of shots are determined so the compounded dose is adequate to the resist threshold, considering the proximity effect of the actual imprint of shots on the insulated target. A dose geometry modulation is applied and rounded shot prints are produced by shots not circular that may overlap. The degree of overlap is determined as a function of desired optimization of fit criteria between a printed contour and the contour of the desired pattern. Placements and dimensions of the shots are determined by a plurality of fit criteria between printed contour and contour of the desired pattern.

13 Claims, 15 Drawing Sheets

(51) Int. Cl.
*H01J 37/302* (2006.01)
*H01J 37/317* (2006.01)
*G03F 7/20* (2006.01)
*G03F 1/68* (2012.01)

(52) U.S. Cl.
CPC ...... *G03F 7/70558* (2013.01); *G06F 17/5068* (2013.01); *H01J 37/3026* (2013.01); *H01J 37/3174* (2013.01); *H01J 2237/31776* (2013.01)

(56) References Cited

U.S. PATENT DOCUMENTS

| | | | |
|---|---|---|---|
| 2011/0089344 A1 | 4/2011 | Fujimura et al. | |
| 2011/0159434 A1* | 6/2011 | Zable | G06F 17/50 430/296 |
| 2012/0219886 A1* | 8/2012 | Fujimura | G03F 1/78 430/5 |
| 2012/0329289 A1* | 12/2012 | Fujimura | H01J 37/3174 438/795 |
| 2013/0201468 A1 | 8/2013 | Manakli | |

\* cited by examiner

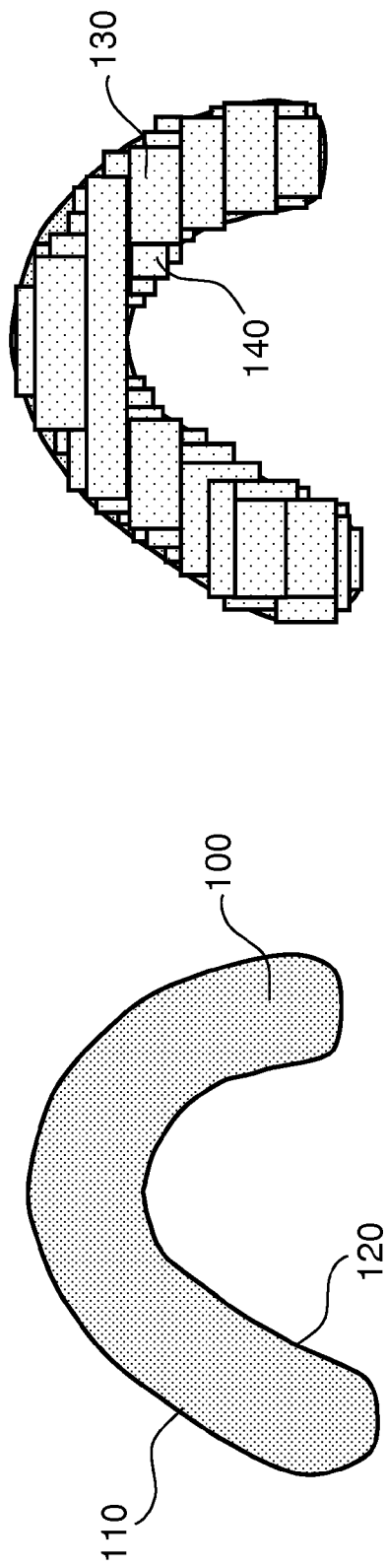
FIG.1b
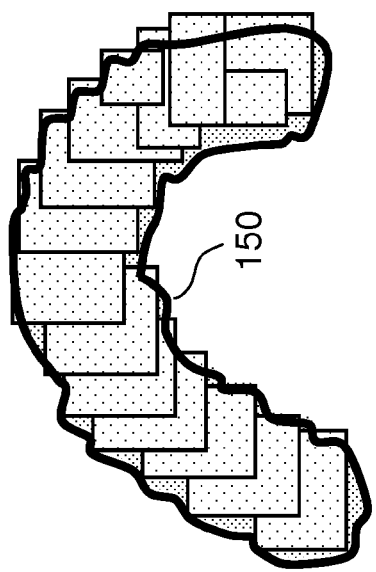
FIG.1c
FIG.1a

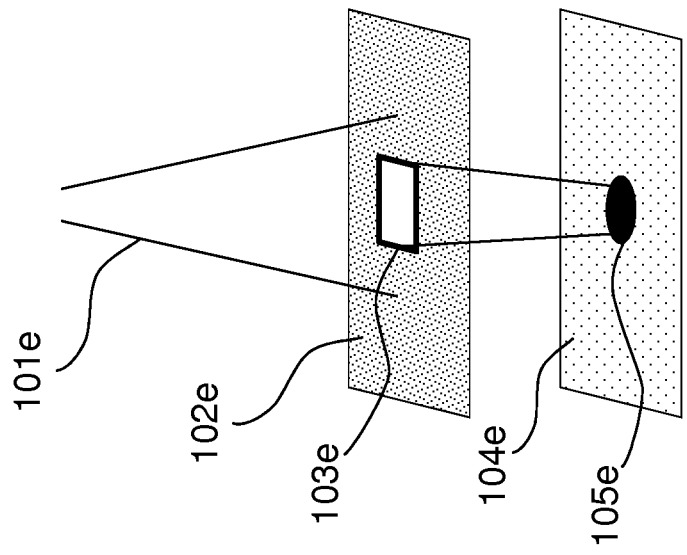
FIG.1e Rounded shot print
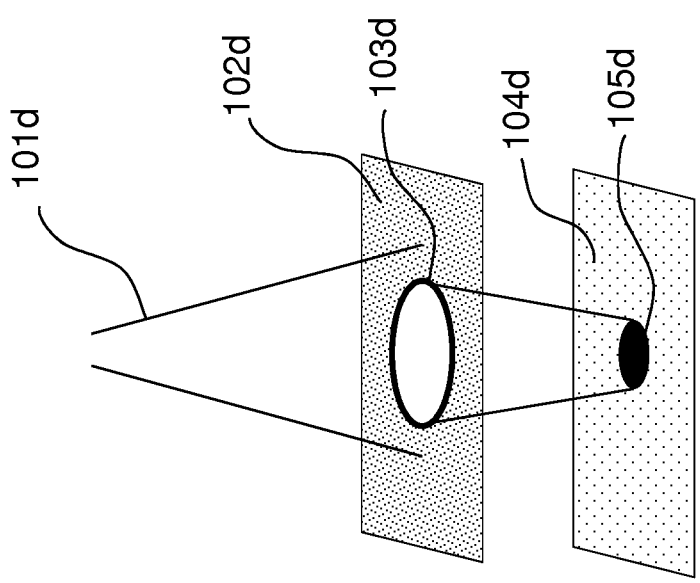
FIG.1d Circular shot

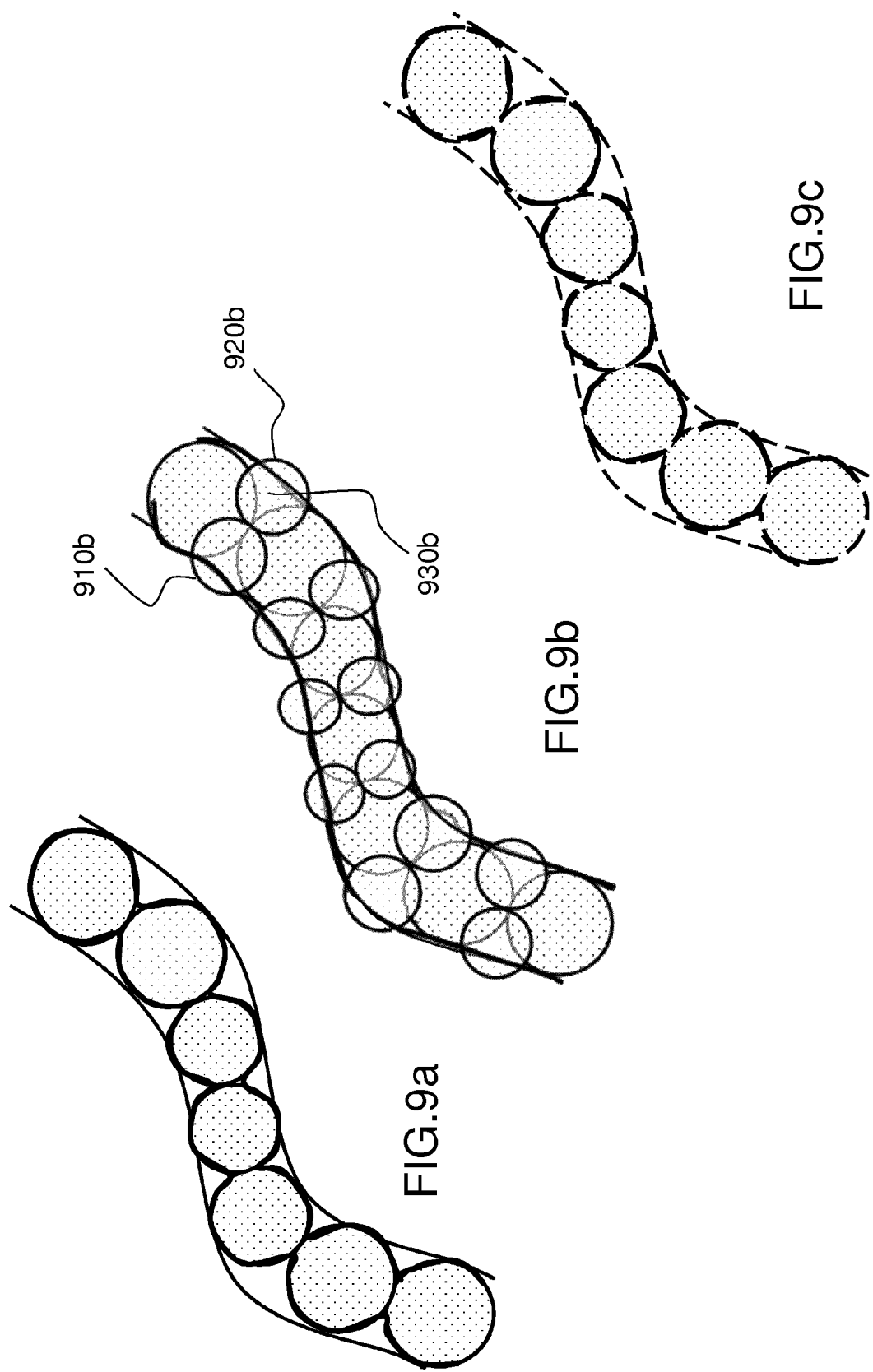

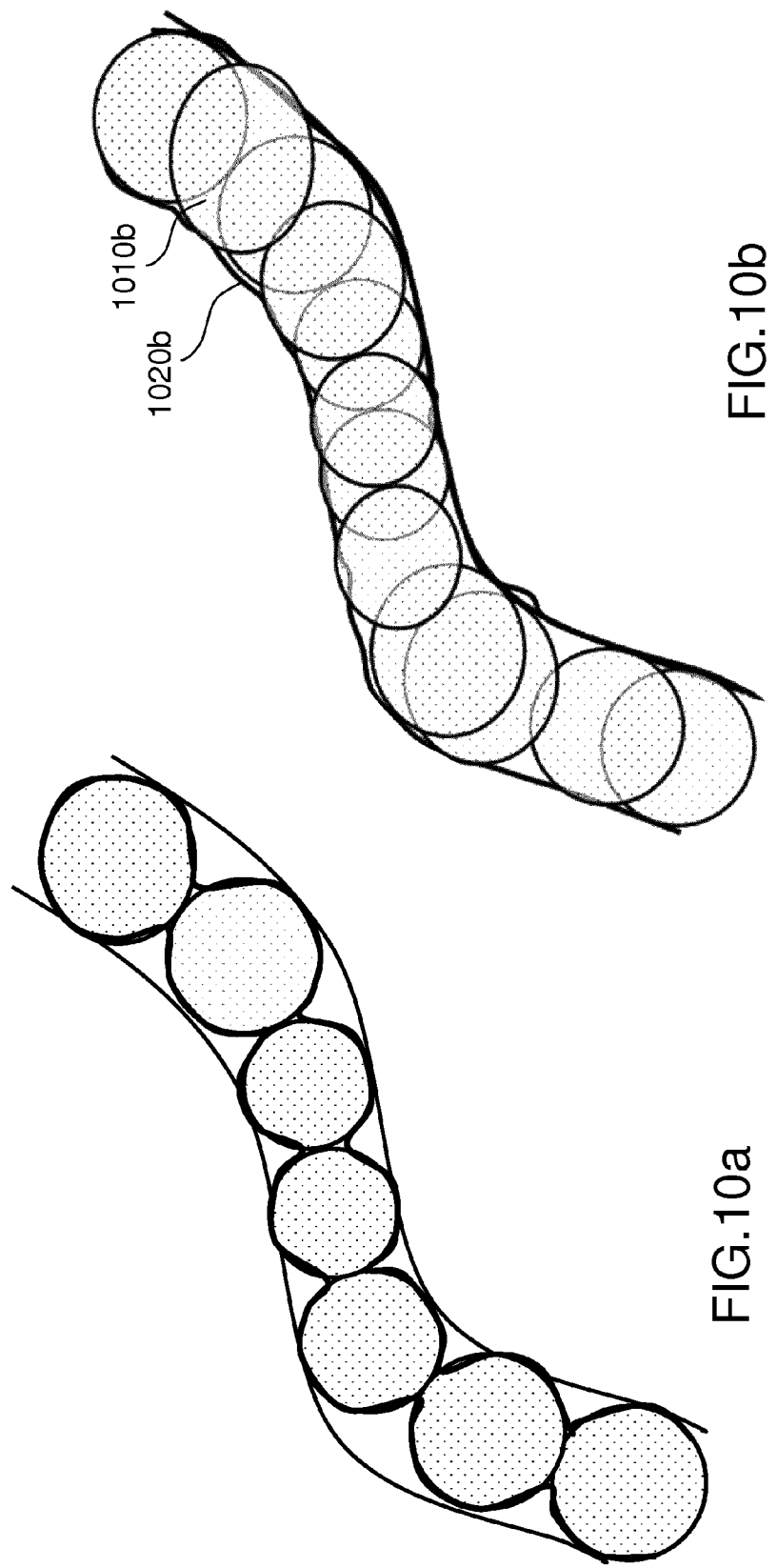

FREE FORM FRACTURING METHOD FOR ELECTRONIC OR OPTICAL LITHOGRAPHY USING RESIST THRESHOLD CONTROL

CROSS-REFERENCE TO RELATED APPLICATIONS

This application is a National Stage of International patent application PCT/EP2014/072948, filed on Oct. 27, 2014, which claims priority to foreign European patent application No. EP 13306483.2, filed on Oct. 30, 2013, the disclosures of which are incorporated by reference in their entirety.

FIELD OF THE INVENTION

The present invention notably applies to the field of electronic or optical lithography of masks for transferring designs on to a substrate. It also applies to processes whereby an electron beam is used to directly write a pattern on a substrate or mask.

BACKGROUND

One way of transferring a pattern on to a surface by e-beam lithography is to use a variable shaped beam or VSB to reveal a positive or negative resist coating. For doing so, during a fracturing step, the pattern is to be cut into elementary forms to which a radiation dose is assigned (known as "shots"). Geometry and radiation dose of the shots are closely interrelated because, at the dimensions which are now used (technologies with a critical dimension or "CD" of less than 60-80 nm), the proximity effects (forward scattering and backward scattering) largely depend on the density of the exposed area.

The patterns to be transferred are quite often of a simple geometric form, such as thin rectangles (lines) or squares (interconnections). In these circumstances, the geometry of the shots is defined accordingly and is also simple: each pattern is fractured into a union of rectangular or square shots.

Nevertheless, for a number of applications (inverse lithography, photonics, metrology calibration, source mask optimization, etc. . . . ), it may be necessary or advantageous to include in the design patterns which are not simple forms of the type previously described, but which may be circles or of an indeterminate, possibly curvilinear, form (further referred to as free-form).

Under these circumstances traditional fracturing is not advantageous because it generates a very high number of shots, especially when pattern fidelity is critical. The writing time increases proportionally to the number of shots, which in turns increases significantly the cost of producing masks or wafers.

It would therefore be advantageous to use a fracturing method capable of adapting itself to indeterminate forms of patterns to be transferred onto a surface. It would be advantageous to be able to use circular shots to fracture free forms.

An attempt in this direction is discussed in U.S. Pat. No. 8,057,970 which discloses an assembly method for forming circular patterns using a plurality of overlapping VSB shots with varying dosages and various successive combinations thereof.

But this prior art document does not properly address the problem of controlling the roughness of the contour of the free form which is actually exposed and the exposure dose.

SUMMARY OF THE INVENTION

It is an object of the present invention to provide a solution to this problem by taking account of the dose level resulting in a definite area of the target design from the proximity effect created by a first series of shots to determine the threshold of the exposure level of a second series of shots.

To this effect, the invention discloses a method of generating a fracturing dataset of a surface into elementary features, said elementary features to be each exposed to at least one shot of a variable shaped beam (VSB) to transfer a free-form desired pattern onto the surface, said method comprising: a step of determining a paving of said free-form desired pattern by a first set of shots which each determine a rounded shot print; a step of determining a placement and dimension of a second set of shots which each determine a rounded shot print; a step of determining a dose level of a shot in the second set of shots, said step of determining being based on a comparison between a dose distribution on the surface resulting from applying the first set of shots and a resist threshold.

Advantageously, the step of determining a dose level of a shot of the second set of shots consists in subtracting from the resist threshold the dose distribution applied by the first set of shots at at least a point of said shot in the second set of shots.

Advantageously, the shots in the first set of shots, which determine rounded shot prints, are not formed by a circular beam and overlap.

Advantageously, the shots in the first set of shots with overlap determine rounded shot prints which overlap.

Advantageously, the shots in the first set of shots, which determine rounded shot prints, are not formed by a circular beam and do not overlap.

Advantageously, the shots in the first set of shots with no overlap determine rounded shot prints which overlap.

Advantageously, the method of the invention further comprises a step of determining a printed contour of the shot prints from the first set of shots and the second set of shots.

Advantageously, a degree of overlap between the rounded shot prints determined by the shots in the first and second sets of shots is set at a level which is determined based on a criteria combining at least minimization of roughness of a printed contour of the shot prints and a minimization of the shot count.

Advantageously, the method of the invention further comprises a step of calculating a fit criteria between the printed contour and the contour of the free-form desired pattern.

Advantageously, the fit criteria is selected to satisfy at least one constraint in a group comprising a maximum roughness of the printed contour, a maximum distance or a minimum surface between the printed contour and the contour of the free-form desired pattern, a minimum size of the shot prints, a minimum value of the process window at the edge of the dose profile.

Advantageously, a placement and a dimension of an individual shot N in a sequence of shots in each one of said first and second sets of shots are determined based on: i) a preset degree of overlap; ii) an evaluation of an improvement of the fit criteria calculated from the N−1 previous shots due to shot N.

Advantageously, the step of determining the placement and dimension of the second set of shots comprises a sub-step of determining areas with no shot print from the first set of shots in an interior of the contour of the free-form desired pattern.

Advantageously, the step of determining the placement and dimension of the second set of shots further comprises a sub-step of substantially filling the areas with no shot print with a number of at least one shot print, placement and position of which are based on an evaluation of an improvement of the fit criteria previously calculated from the N shots in the first set of shots.

Advantageously, the method of the invention further comprises: a new step of determining a placement and dimension of a new second set of individual shots which each determine a rounded shot print; a new step of determining a resist threshold to be used in a calculation of a dose level of a shot in the new second set of shots, said step of determining being based on a dose distribution resulting from applying the first set of individual shots; said new steps of determining being performed as long as the fit criteria is worse than a predetermined level.

Advantageously, the method of the invention further comprises a step of generating a data preparation file, said file containing the geometry and dose levels of the first set of shots and the second set of shots.

The invention also discloses a computer program for generating a fracturing dataset of a surface into elementary features, said elementary features to be each exposed to at least one shot of a variable shaped beam (VSB) to transfer a free-form desired pattern onto the surface, said computer program comprising: a module configured for determining a paving of said free-form desired pattern by a first set of individual shots which each determine a rounded shot print; a module configured for determining a placement and dimension of a second set of individual shots which each determine a rounded shot print; a module configured for determining a dose level of a shot in the second set of shots, said step of determining being based on a comparison between a dose distribution on the surface resulting from applying the first set of individual shots and a resist threshold.

In certain embodiments, a predetermined roughness tolerance level can be complied without using any overlapping shots. In certain embodiments, the invention provides a significant reduction of the number of shots which are needed to minimize the roughness of the contour of the free form. Also, the method of the invention offers better robustness to the fluctuations of the process, because of the overexposure used in preferred embodiments. Because the number of shots is reduced in relation to the prior art, the size of the dataprep file is reduced.

BRIEF DESCRIPTION OF THE DRAWINGS

The invention will be better understood and its various features and advantages will become apparent from the description of various embodiments and of the following appended figures:

FIGS. 1a, 1b and 1c illustrate a method of the prior art to fracture a free form target design;

FIGS. 1d and 1e illustrate two methods for forming a rounded shot print in a resist;

FIGS. 9a, 9b, 9c, 9d and 9e illustrate the four main steps of implementing the method of the invention and a view of the shots to print in other embodiments;

FIGS. 10a and 10b illustrate the implementation of the method in yet another embodiment;

DETAILED DESCRIPTION

Figure 2A:
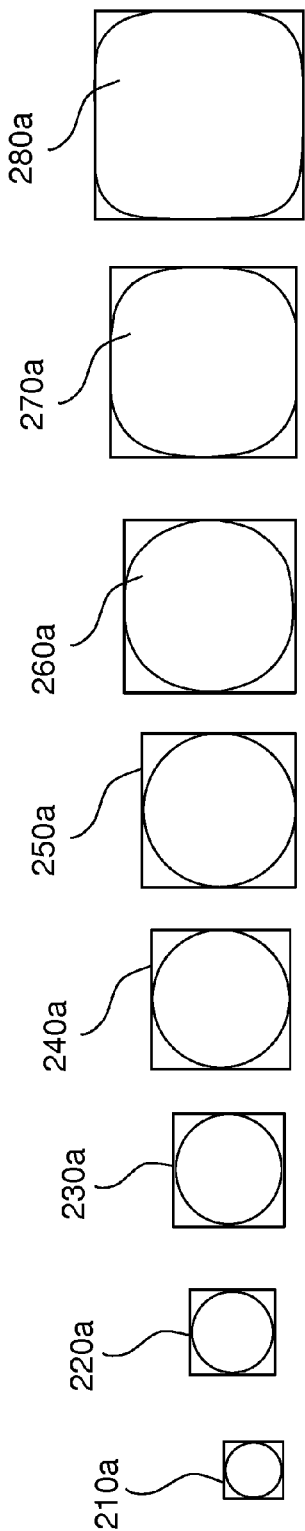
FIGS. 2a and 2b respectively represent the shape of a shot print on the resist at various CDs for a defined PSF and the variation of the dose density as a function of the CD for the same PSF.

FIGS. 1a, 1b and 1c illustrate a method of the prior art to fracture a free form target design.

A curvilinear form 100, having brims 110, 120 can be insulated using a series of shots 130, 140, which can be deemed at the dimensions which are discussed in the framework of this invention (for instance a critical dimension or CD in the region of around 60-80 nm) to create a circular imprint (see below). Typically, the form 100 and the largest shots 130 will have a width of around 200 nm. If the shots do not overlap, like on FIG. 1b, the brims of the curvilinear form will have significant roughness at the loci in between two successive, tangential, shots. Allowing two successive shots to overlap, like on FIG. 1c, will alleviate a bit the problem, as can be seen in the areas of the curvilinear form where the curve radius is infinite. But where the curve radius is small, like at loci 150, the overlap will procure an excessive dose and the brim will be uneven, which will affect the functional properties of the circuit to a significant extent. Also, this prior art method will be less robust to the fluctuations of the process.

FIGS. 1d and 1e illustrate two methods for forming a rounded shot print in a resist.

On FIG. 1d, a patterning beam 101d is shaped through a round hole 103d in a stencil 102d in the writing tool of the equipment. The shot print 105d on the substrate 104d is circular. This type of insulation is referred to in this specification as "circular shots".

On FIG. 1e, a patterning beam 101e is shaped through a hole of a non round shape 103e in a stencil 102e in the writing tool of the equipment. The shot print 105e on the substrate 104e is made to be of a rounded shape by a proper adjustment of the exposure dose and the geometry of the shape 103e, as is explained below. This type of insulation is referred to in this specification as "rounded shape imprints".

Typically, the aperture of the stencil and the shot prints will have dimensions of the order of the a parameter of the PSF (20-50 nm).

Figure 2B:
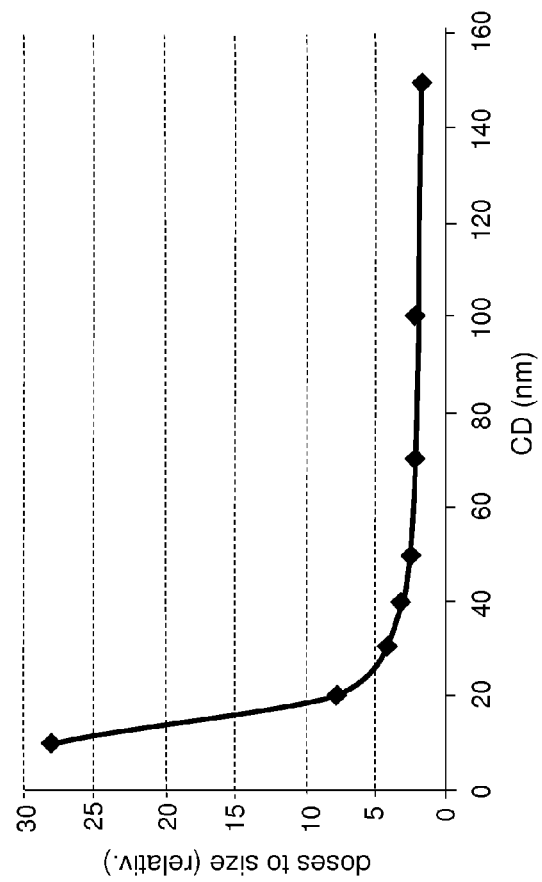

FIGS. 2a and 2b respectively represent the shape of a shotprint on the resist at various CDs for a defined PSF and the variation of the dose density as a function of the CD for the same PSF.

According to some embodiments of the invention, to insulate curvilinear desired patterns, it is beneficial to use shots which leave a circular imprint on the resist. This is because the number of shots will normally be minimized in that case. According to the prior art, notably U.S. Pat. No. 8,057,970, circular shots are created either directly through a stencil of a circular shape, as illustrated on FIG. 1d, or by a combination of overlapping rectangular shots. According to the embodiments of the invention described here, use is made of a property of shots at small CDs to behave generally as circular and not square or rectangular shots.

As an illustrative example of this behavior, FIG. 1a displays a number of shots for a point spread function (PSF) with an a parameter of 30 nm for a point spread function (PSF) composed of three Gaussian functions with a short range alpha parameter of 30 nm with a relative weight of 1, a middle range beta parameter of 268 nm with a relative weight of 0.3 and a long range beta parameter of 10 μm with a relative weight of 0.6. In the case the relative resist threshold is 0.5. The shots which are illustrated on FIGS. 210a, 220a an 220a have a CD of respectively of α/3 (10 nm), 2α/3 (20 nm) and α (30 nm). These shots are circular and not square, as they are indeed intended to be. They could be usable for the purpose of the invention, but in practice, the shots with a CD below α (210a and 210b) cannot be used because the dose needed to insulate the resist down to the bottom is too high (respectively a Dose To Size ratio of 28 and 8). Shots 240a and 250a have a CD of respectively 4α/3 and 5α/3 and are perfectly round. When the CD exceeds 2α, like for shots 260a, 270a and 280a (CDs of respectively 70 nm, 100 nm and 150 nm), the shape of the shot becomes closer to a square and these shots are more difficult to use to implement the invention.

FIG. 2b displays the evolution of the DTS as a function of the CD for the process of FIG. 2a (α of the PSF=30 nm). It can be seen that the variation of the DTS is small when the CD is between 50 and 70 nm or around 2α. At the same time, the shape of shot is almost perfectly circular. Therefore, for free form target designs with a CD in between roughly α and 2α, it will be possible, to implement the invention, to use adequate shots which will behave like circular shots when insulated.

Figure 3A:
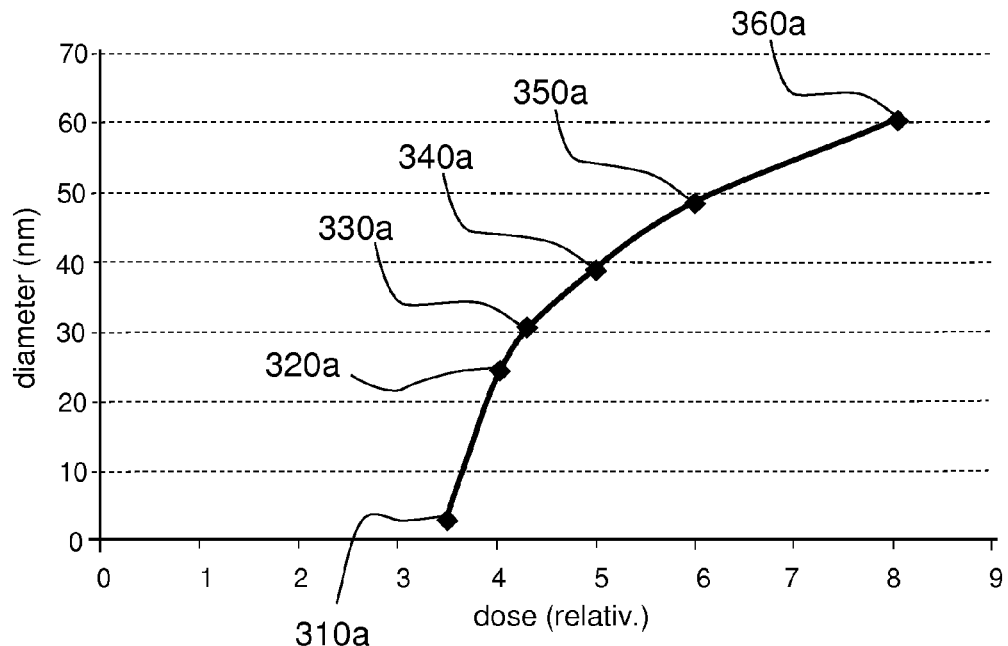
FIGS. 3a and 3b respectively display, for a defined PSF and a defined CD, a graph of the variation of the diameter of a rounded shot print in a resist as a function of the dose density and a representation of the shot prints for certain points on the graph.
Figure 3B:
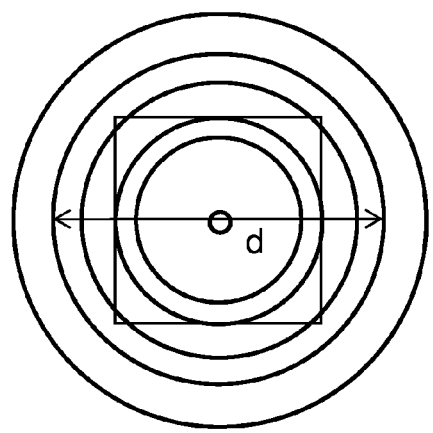

FIGS. 3a and 3b respectively display, for a defined PSF and a defined CD, a graph of the variation of the diameter of a rounded shot print as a function of the dose density and a representation of the shot prints for certain points on the graph.

The process used has the same features as the one of FIGS. 2a and 2b (α of the PSF=30 nm). In the example illustrated on FIGS. 3a and 3b, the process is targeted at geometries with CD=α.

It can be seen from FIG. 3a that the curve has a steep slope below α and a smoother slope above α. Therefore, the diameter of the shot print increases rapidly with the dose below α (from 3 nm for a relative dose of 3.5 at point 310a to 30 nm (=α) for a relative dose of 4.28 at point 330a). Then, the diameter of the shot print increases less rapidly with the dose between α and 2α (from 39 nm for a relative dose of 5 at point 340a to 60 nm for a relative dose of 8 at point 360a).

The outside perimeters of the shot prints corresponding to these points are estimated and the results of the estimation are displayed on FIG. 3b. The process used has the same features as the one of FIGS. 2a and 2b (a of the PSF=30 nm).

To implement the invention, estimation of the outside perimeters of the shot prints can be based on a full simulation using a PSF precisely adapted to the use case (direct write/mask printing; type of the material and the resist used, etc. . . . ) or on a rougher estimation using, for instance, a simpler function or an abacus which gives the values of the shot print diameters as a function of the dose to resist ratio for a defined physical configuration and a defined CD. Full simulation is more precise but requires significant computing resources. For a number of applications, an estimation based on an abacus can produce results which are precise enough.

Figure 4A:
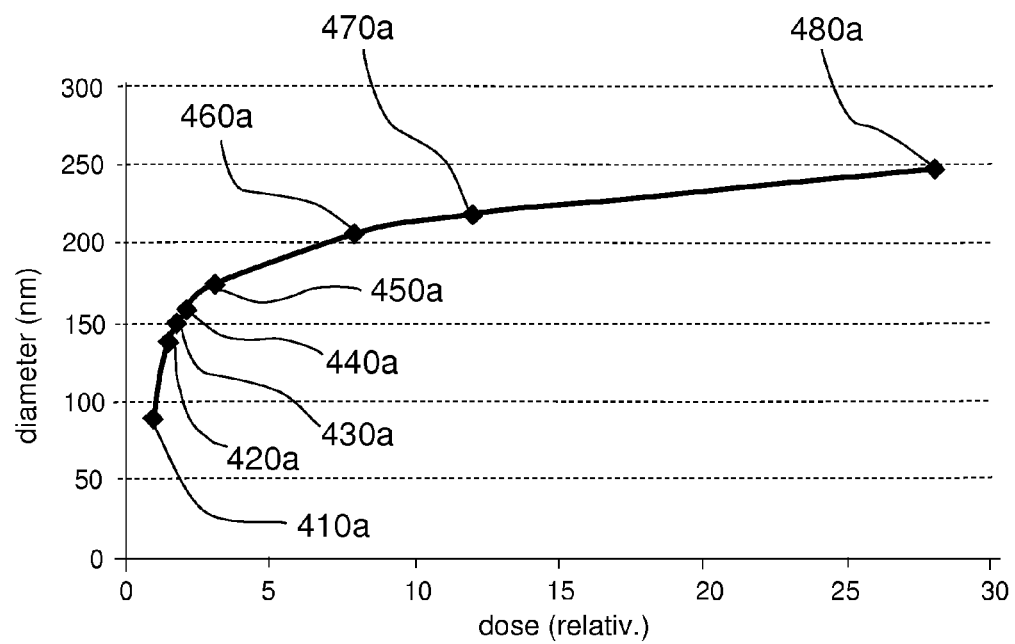
FIGS. 4a and 4b respectively display, for the same PSF as on FIGS. 3a and 3b and another defined CD, a graph of the variation of the shape and dimension of a shot print as a function of the dose density and a representation of the shot prints for certain points on the graph.
Figure 4B:
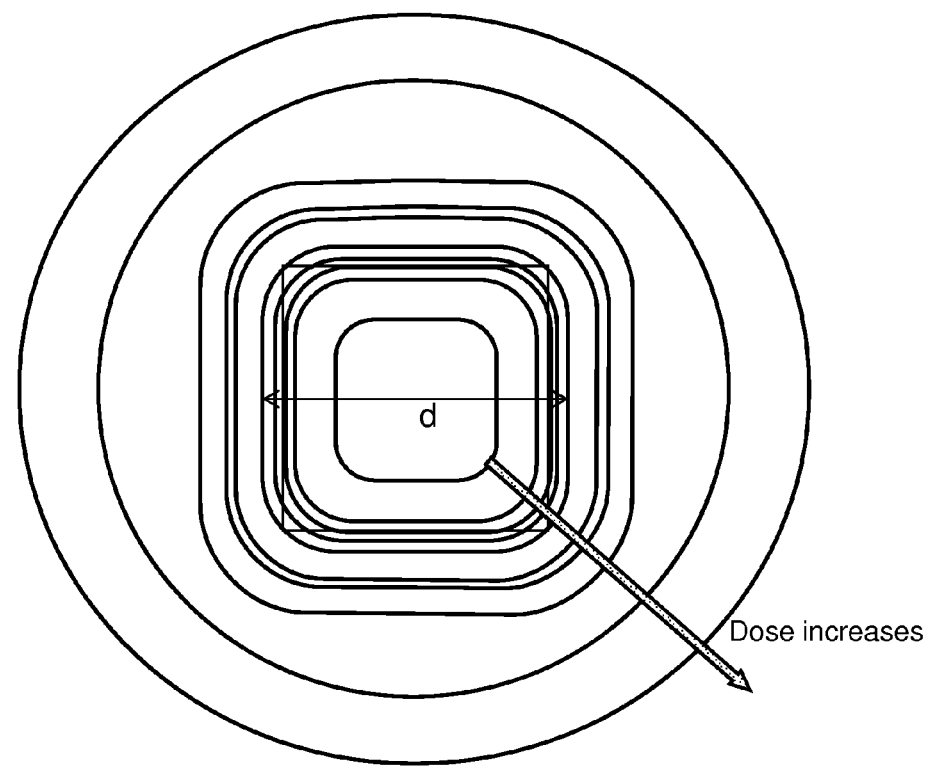

FIGS. 4a and 4b respectively display, for the same PSF as on FIGS. 3a and 3b and another defined CD, a graph of the variation of the shape and dimension of a shot print as a function of the dose density and a representation of the shot prints for certain points on the graph.

The process used has the same features as the one of FIGS. 2a and 2b (a of the PSF=30 nm). In the example illustrated on FIGS. 4a and 4b, the process is targeted at geometries with CD=5α (150 nm).

It can be seen from FIG. 4a that the curve has a steep slope below 5α and a smoother slope above 5α. Therefore, the dimension of the shot print increases rapidly with the dose below α (from 90 nm for a relative dose of 1 at point 410a to 150 nm (=5α) for a relative dose of 1.8 at point 430a). Then, the dimension of the shot print increases less rapidly with the dose above 5α (from 158 nm for a relative dose of 2.1 at point 440a to 248 nm for a relative dose of 28 at point 480a). The outside perimeters of the shot prints corresponding to these points are estimated and the results of the estimation are displayed on FIG. 4b. The process used has the same features as the one of FIGS. 2a, 2b, 3a and 3b (a of the PSF=30 nm). Above a dose level, the shape of the shot print becomes rounded. This threshold depends on the CD but the change in shape starts roughly when the dose is about 10 times to 15 times the dose to print the shape on target (at its nominal CD).

It is possible to use different shapes of the holes in the stencil to have shot prints which are more adequate for the form of the target contour.

FIGS. 5a, 5b, 5c and 5d respectively represent a target design, the shot prints which are determined to fracture this design with their individual printed contour, the same shot prints with the contour of groups of shot prints, the comparison between the target design and the global printed contour.

The size of the geometries on these figures is, by way of example only, between α and 5α.

Figure 5B:
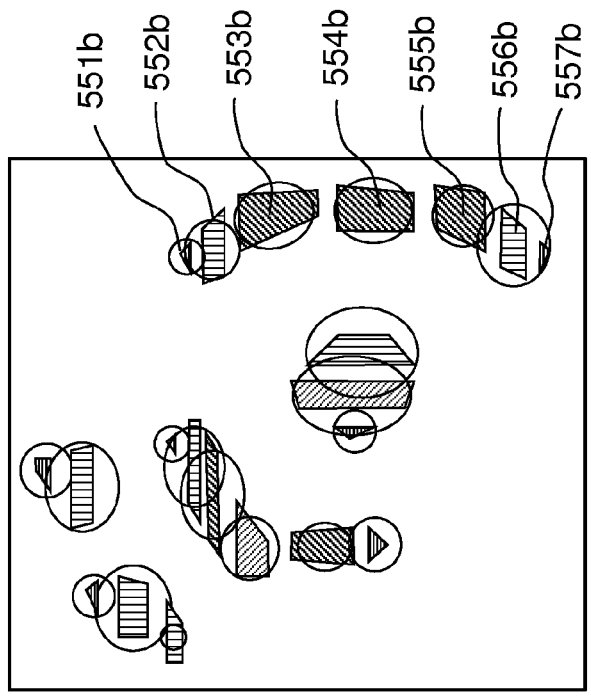
FIGS. 5a, 5b, 5c and 5d respectively represent a target design, the shot prints which are determined to fracture this design with their individual printed contour, the same shot prints with the contour of groups of shot prints, the comparison between the target design and the global printed contour.
Figure 5A:
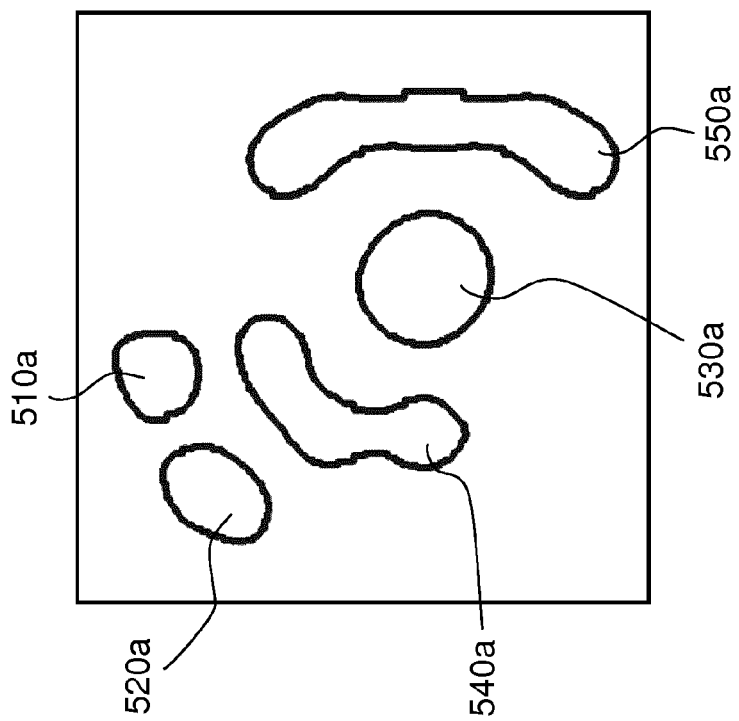
Figure 5D:
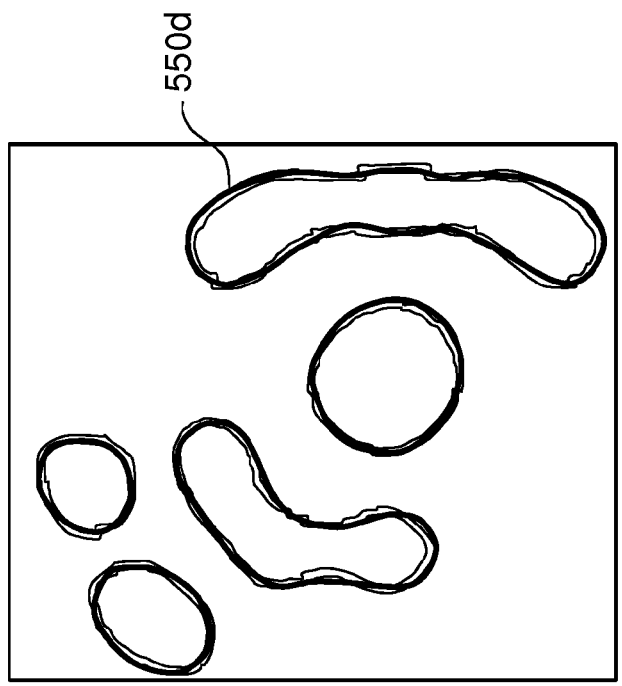

FIG. 5a represents a target free form design with three quasi-circular forms 510a, 520a, 530a and two curvilinear forms 540a, 550a. The CD of this design is around α (29 nm, for a process with a PSF with an a parameter of 30 nm).

According to one embodiment of the invention, as displayed on FIG. 5b, a first fracturing in individual shot prints is performed. In this case, the shots are not square or rectangular and the shot prints are not exactly circular, but still have a rounded shape. By way of example, we take the element 550a of FIG. 5a. According to the calculation which is performed to implement the invention, as will be explained further in the description, element 550a is fractured in seven sub-elements 551b, 552b, 553b, 554b, 555b, 556b and 557b. The shape and orientation of these sub-elements can be diverse, based on the assumption that the VSB tool can accommodate these parameters. In this implementation, the individual shot prints are non-overlapping. The contour of each individual shot print is estimated. Or when the contours of sub-elements are overlapping, like in the case of sub-elements 556b and 557b, the calculation is applied to the combination of shot prints, the contour of which overlap. Then, a proximity effect correction algorithm is applied to each estimated shot print (or group of shot prints). Advantageously, a proximity effect correction algorithm of the type disclosed by PCT application published under no WO2011/128393 will be used. Such an algorithm allows simultaneous dose and geometry optimisation using energy latitude.

Figure 5C:
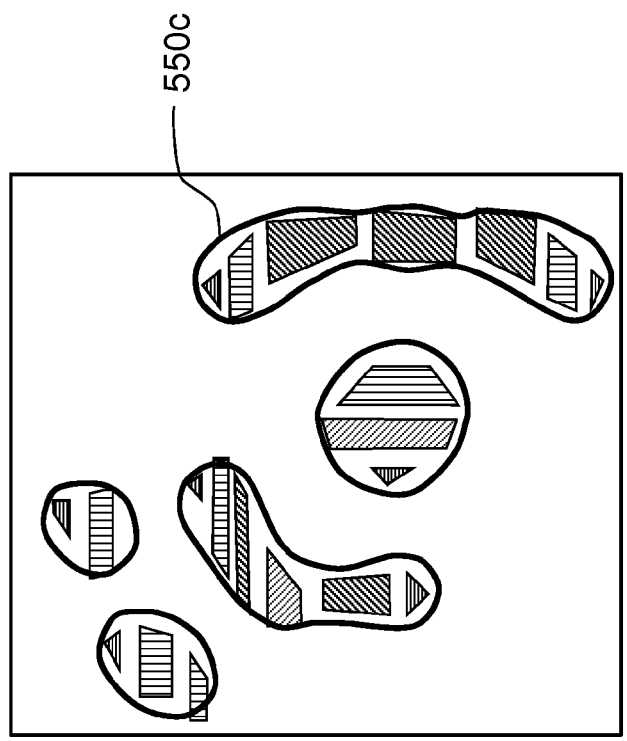

The results of the next calculation, which include the impact of the proximity effect correction are displayed on FIG. 5c, with a line showing the consolidated contour of a topologically continuous element 550c.

The contour of estimated element 550c is then superimposed on the desired contour of the target element 550a. If there are differences, the process of the invention is then replayed until the roughness of the resulting contour 550a is within a set tolerance of the target design 550a. Roughness is defined by a local function which calculates the difference between the estimated and the target contours.

We note that different dose levels are applied to different shots: the dose level to form shot prints 552b, 556b is different from the dose levels applied to form shot prints 553b, 554b, 555b. Also, shot prints of approximately the same size (552b through 556b) may be deemed to form a first set of shot prints, whereas shot prints of a smaller size (551b and 557b) will be treated as a second set of shots to allow a calculation of their dose level as a function of the dose level of the first set of shot prints. There may be more than two sets of shot prints, to allow a more precise match between the estimated contour and the contour of the target design, as will be explained below.

We also note that the shapes of the insulating shots can be diverse (squares, rectangles, triangles, trapezoids . . . ) if allowed by the e-beam equipment. The shot prints may also be made to overlap the contour of the target design if this allows a better match of the estimated contour with the contour of the target design. This gives more flexibility to achieve this goal.

Figure 6:
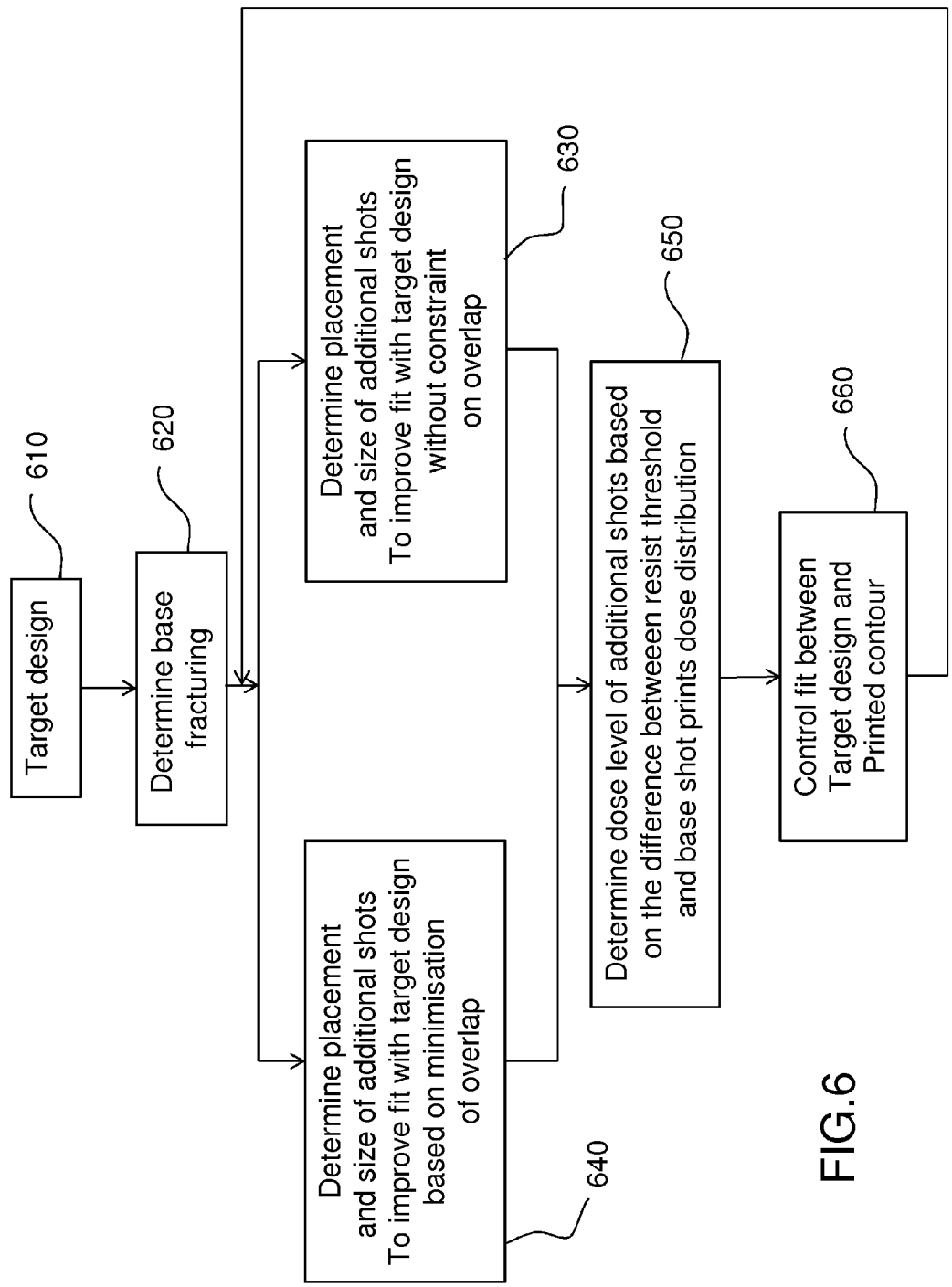
FIG. 6 displays a flow chart of a method according to certain embodiments of the invention.

FIG. 6 displays a flow chart of a method according to certain embodiments of the invention.

This flow chart displays another embodiment of the invention wherein the initial shots are substantially of the same size and overlapping. Additional features are then placed to minimise the roughness of the printed contour in view of the target design. The structural features of this embodiment will be commented upon in relation to FIGS. 8a, 8b, 8c, 8d, 9a, 9b, 9c, 9d, 10a, 10b and 10c.

At an initial step 610, the target design is entered into a computer program.

At subsequent step 620, a base fracturing is determined, based on ageometry of elementary equal round shot prints, the dimension of which is determined by the topology of the target element. Various procedures can be applied for this determination, which will be described in relation to FIGS. 8 to 10. A procedure for determining the dimensions of the paving of the target design has been disclosed in PCT application no PCT/EP2013/053883 assigned to the same applicant.

There are then two possible embodiments of the invention, one in which a constraint is imposed on the level of overlap between the elementary shots (step 630), another one in which no constraint of this type is applied (step 640).

By way of example only, among various possibilities offered to define a type of constraint applicable to the degree of overlap, this constraint can be applied to the degree of overlap between the shots of one of the sets of shots and/or between the shots in a first set of shots and the shots in a second set of shots. The constraint may be defined as a function of the type of shape of the target design.

On <<wire>> like shapes of the type depicted on FIGS. 9a through 9d, it is advantageous to limit the overlap between the first and the second set of shot prints to 50% of the surface of the shots from the second set, because it would provide best tradeoff between edge roughness and shot count. In this embodiment the shot prints from the first set of shot prints could have a limited to no overlap, maybe ⅕ maximum of their surface. This embodiment would substantially produce the shot prints configuration depicted in FIG. 9.

Figure 11A:
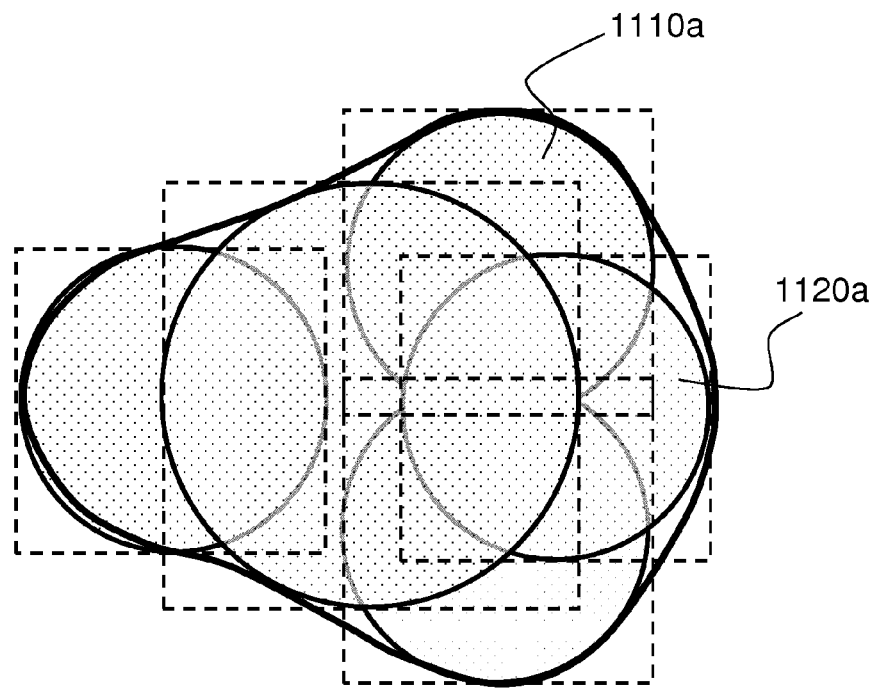
FIGS. 11a and 11b illustrate the implementation of the method of the invention for a specific target design.
Figure 11B:
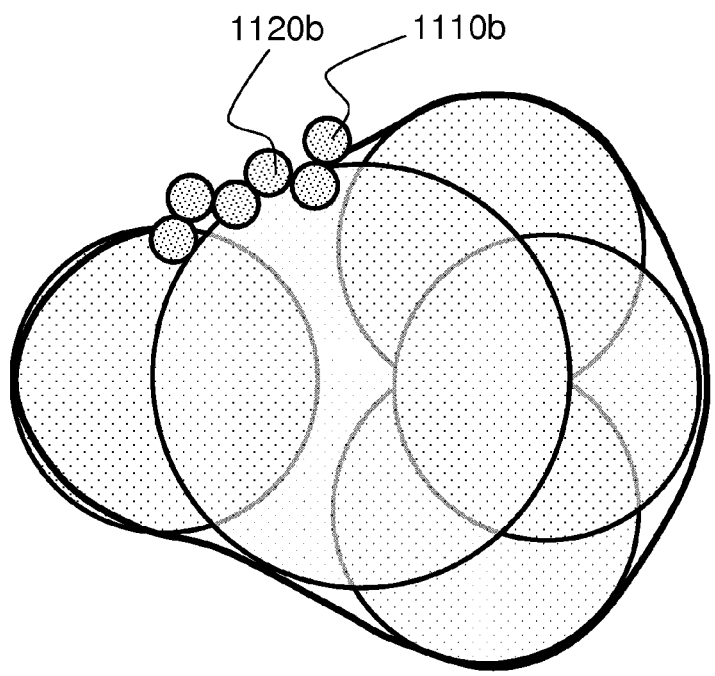

On compact shapes of the type depicted on FIGS. 11a and 11b, it will be more advantageous to allow much more overlap (up to ⁸⁄₁₀ for any set of shots), which will procure, in this case, a better tradeoff between roughness and shot count.

In any case the advantage of overlapping shots is to smooth edge roughness thanks to double dose contribution in between the shots. However more overlap means a better roughness but also more shots. That is why the amount of overlap is a critical parameter and should be tuned carefully.

According to some embodiments of the invention, it is possible to allow the user to choose the amount of overlap through a parameter in the algorithm. This parameter can be expressed as a percentage of surface overlap, a tolerance to roughness, or a pitch to place the shots along the medial axis.

Then, at step 650, the dose level of additional shots is determined based on the dose distribution of the elementary shot prints, as will be explained in relation to FIGS. 7a, 7b, 7c and 7d.

Then, at step 660, a function to evaluate the fit between the printed contour and the contour of the target design is applied. If the function returns a result which is within a predetermined tolerance, the procedure ends. If not, the previous steps are replayed until this is the case.

Figure 7B:
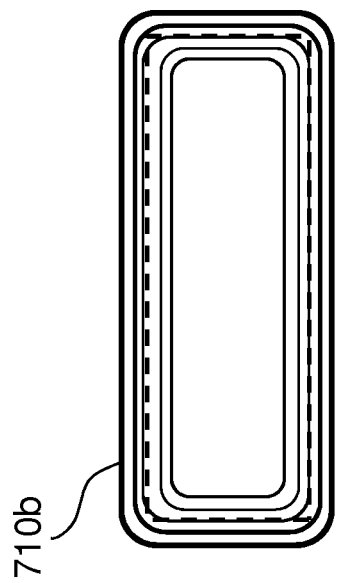
FIGS. 7a, 7b, 7c and 7d illustrate the determination of the dose level of an exposure of a defined CD in an embodiment of the invention.
Figure 7C:
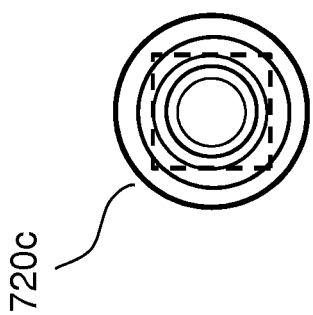
Figure 7A:
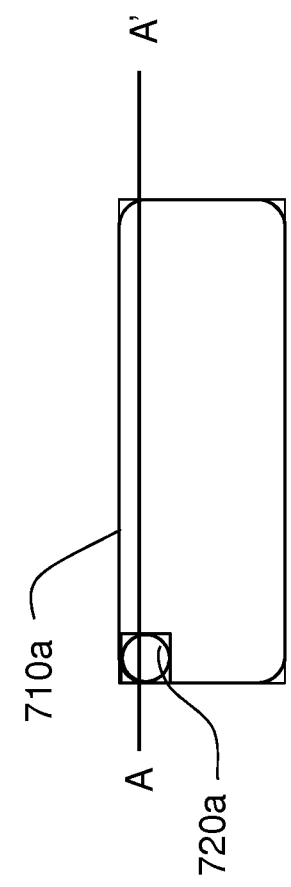

FIGS. 7a, 7b and 7c illustrate the determination of the dose level of an exposure of a defined CD in an embodiment of the invention.

The diameter of the shot prints are typically between α and 5α. The width of a form to be insulated is of the same dimension, while its length can vary a lot.

To apply the procedure of the invention, as explained above in relation to FIG. 6, we need to determine the dose level which is to be applied to overlapping shot prints as a function of the geometry of the shot prints and of the dose level of the first shot prints which are insulated.

We first need to determine the printed contour of the first set of shot prints, taking account of the proximity effects, as illustrated in relation to shot print 710a, the actual contour of which is displayed on FIG. 7b by line 710b. The same procedure is applied to overlapping feature 720a of FIG. 7a and the contour of this feature is displayed on FIG. 7c by line 720c.

Figure 7D:
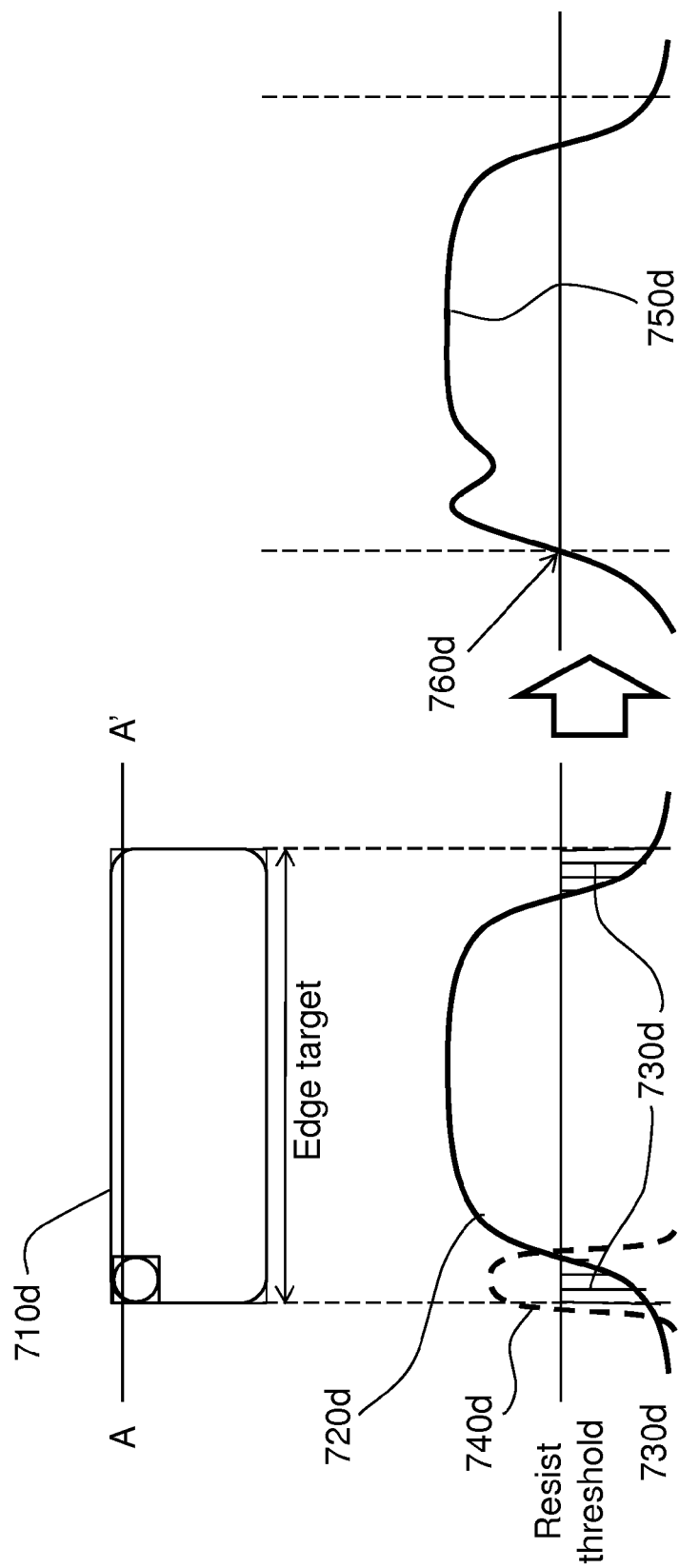

Then, the dose level to be applied to shot 720a is determined as a function of the dose level applied to feature 710a and the desired dose level of the compounded element where the two doses are superimposed. This is done by using a determined compounded threshold in relation to the resist threshold (for instance, 0.5). As illustrated by FIG. 7d, the dose level to be applied will be determined, for instance, by subtracting the dose resulting from the first set of shots from the threshold. In other words, the principle of calculation of the dose levels of overlapping shot prints is that the dose levels are additive. FIG. 7d illustrates the calculation of the composition of the dose levels along line 710d (AA' on FIG. 7a). The curve 720d displays the dose level of the first set of shots. Regions 730d display the missing dose from the first set of shots to match the edge target. The curve 740d displays the dose level of a second set of shots which is calculated to fill the missing dose from the first set of shots. The curve 750d displays the dose level resulting from the composition of the first and second sets of shots, or global dose profile. We note that the global dose profile crosses the resist threshold line at the edge target 760d.

FIGS. 8a, 8b, 8c and 8d illustrate the four main steps of implementing the method of the invention in a number of its embodiments.

In the embodiment which is represented on these figures, a first set of shots 820a, 830a is determined based on the dimensions of a curvilinear free form 810a which forms the target design. The free form may have a length of a few hundreds of nm, up to a few microns, while the shot prints will have a diameter if between a few tens of nm up to a few hundreds of nm.

A second set of shots 810b, 820b, 830b, 840b is then determined to fill the gaps between the first set of shot prints and the contour of the target design. The dimensions of the second set of shot prints are determined so that the gaps are actually filled by said second set of shot prints.

Figures 8A, 8B:
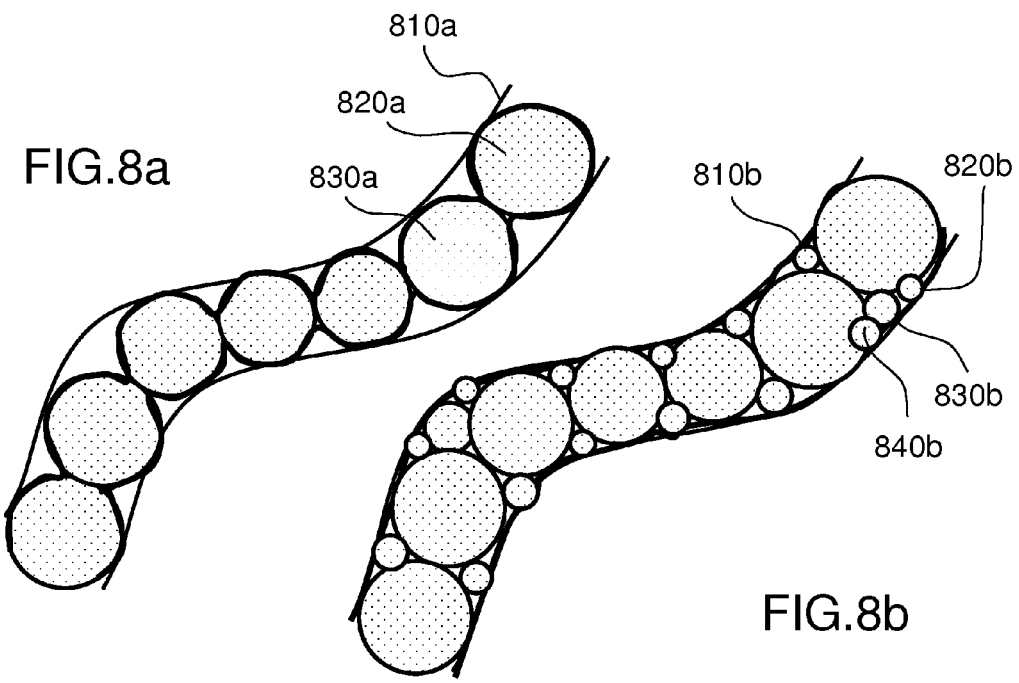
FIGS. 8a, 8b, 8c and 8d illustrate the four main steps of implementing the method of the invention in a number of its embodiments.
Figures 8C, 8D:
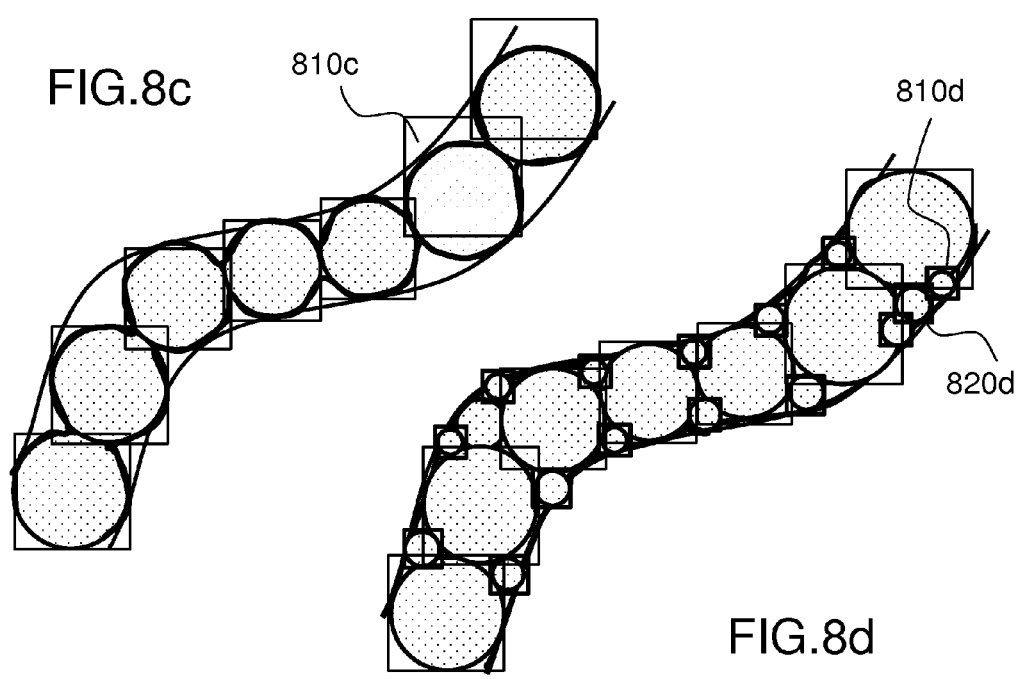

The doses of the first set of shots are determined by the procedure explained in relation to FIGS. 7a through 7d, taking into account the degree of overlapping of these shot prints which is displayed on FIG. 8c (for example item 810c).

Likewise, the doses of the second set of shots are determined by the same procedure, taking into account the degree of overlapping of these shot prints which is displayed on FIG. 8d (for example items 810d and 820d).

Then, a procedure to assess the roughness of the printed contour in relation to the contour of the target design is carried out, as explained above in relation to FIG. 6 (step 660). The whole procedure, or some steps thereof, are replayed, if the roughness exceeds a predetermined tolerance threshold.

FIGS. 9a, 9b, 9c and 9d illustrate the four main steps of implementing the method of the invention in other embodiments.

According to this other embodiment of the invention, the second set of shots is not determined so as to fill the gaps left by the first set of shot prints. The shots of the second set 910b, 920b are positioned to overlap the first set of shot prints and their contour, as illustrated by FIG. 9b. As for the previous embodiments, the free form may have a length of a few hundreds of nm, up to a few microns, while the shot prints will have a diameter in between a few tens of nm up to a few hundreds of nm.

The position of the shot prints of this second set is determined by placing their centre 930b at a barycentre of the gap left open by two adjacent shot prints of the first set.

Figure 9E:
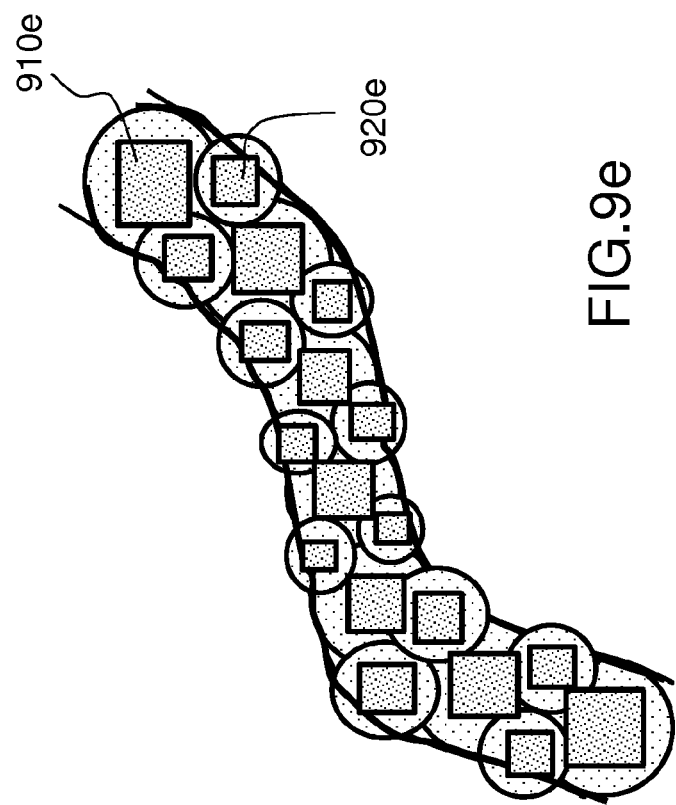
Figure 9D:
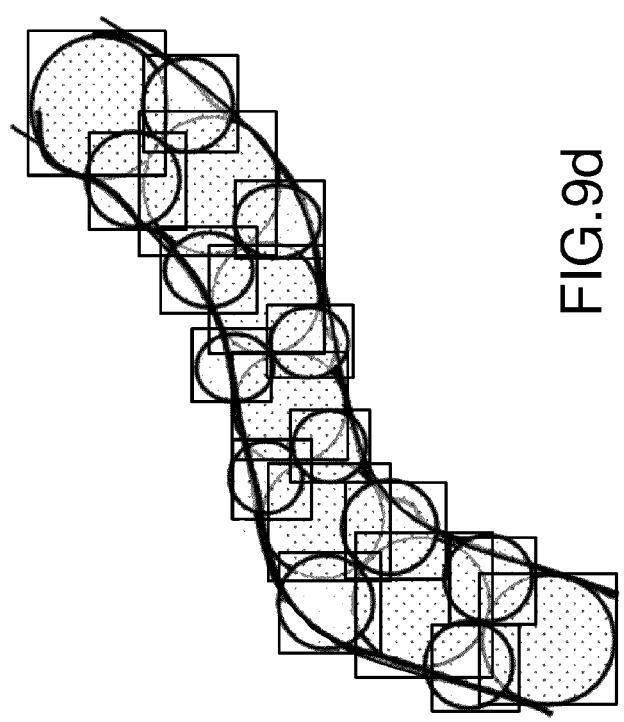

The dose level of the shot of the second set is adjusted downward accordingly as illustrated by FIG. 9d.

The procedure to measure the fit of the printed contour with the contour of the target design is applied in the same manner as illustrated for the previous embodiment.

It is to be noted that the first and second sets of shots can be cast with an equipment which does not authorize overlap. This constraint does not prevent the shot prints from overlapping, as illustrated by FIG. 9e, where reference 910e represents a shot in the first set and reference 920e represents a shot in the second set. There is neither an overlap between the shots in one of the first and second sets nor an overlap between shots in one of the two sets.

FIGS. 10a and 10b illustrate the implementation of the method of the invention in yet another embodiment.

In this embodiment, a first set of shot prints is made of adjacent shot prints, like in the embodiments described by FIGS. 8a and 9a. As for the previous embodiments, the free form may have a length of a few hundreds of nm, up to a few microns, while the shot prints will have a diameter if between a few tens of nm up to a few hundreds of nm.

A second set of shot prints of approximately the same dimensions as those in the first set is then formed on top of the first set. The shots in this second set are centered on the same line as the shots in the first set (or shifted, for instance, according to the symmetry of the empty spaces after the first set). Their shape and dose level are selected to match the contour of the target design by applying a procedure similar to those applied in the previous embodiments, except that size is taken as similar as that of the shot prints in the first set and that the centers of the shot prints are positioned on a medial line or a branch of a skeleton of the target curvilinear form, at half the distance between the centers of the shot prints in the first set. The dose levels of the shots in the second set are calculated in the same way as in the previous embodiments.

FIGS. 11a and 11b illustrate the implementation of the method of the invention for a specific target design.

According to this other embodiment of the invention, the target design is paved with a first set of overlapping shot 1010a, 1020a. In this embodiment, the dimension of the free form will be around a hundred of nm.

The brim of the shots in the first set are then paved by a second set of shots 1010b, 1020b. The calculation of the dose levels of the second set of shots is similar to those applied in the other embodiments described above.

The various embodiments described above may be, to a certain extent, combined together, so as to optimise the paving by a first set of shots and a second set of shots. These first and second set of shots may be insulated in a same pass or in two or more subsequent passes. The process can be used to directly insulate a wafer (direct writing) or to insulate a mask. Standard e-beam lithography as well as laser writing equipment can be used. The invention is mostly implemented in a software which is configured to produce dose and position data which can be input in the fracturing and proximity effect correction modules of the equipment. The computer program used to implement the invention can be run a number of times, with more than two sets of shots, so that the target of the optimisation criteria is met. The invention has been mostly described in cases when optimisation was driven by the roughness of the contour. It is also possible to add in the optimisation criteria a maximum distance or a minimum surface between the contour of the printed design and the contour of the target design, a minimum size of the shot prints or a minimal value of the process window at the edge of the dose profile.

The examples disclosed in this specification are only illustrative of some embodiments of the invention. They do not in any manner limit the scope of said invention which is defined by the appended claims.

The invention claimed is:

1. A method of generating a fracturing dataset of a surface into elementary features utilizing a computer, said elementary features to be each exposed to at least one shot of a variable shaped beam (VSB) to transfer a free-form desired pattern onto the surface, said method comprising:

a step of determining with the computer a paving of said free-form desired pattern by a first set of shots which each determine a rounded shot print;

a step of determining with the computer a placement and dimension of a second set of shots which each determine a rounded shot print;

a step of determining with the computer a dose level of a shot in the second set of shots, said step of determining being based on a comparison between a dose distribution on the surface resulting from applying the first set of shots and a resist threshold;

a step of determining with the computer a printed contour of shot prints from the first set of shots and the second set of shots; and a step of calculating with the computer a fit criteria between the printed contour and a contour of the free-form desired pattern, wherein the fit criteria is selected to satisfy at least one constraint in a group comprising a maximum roughness of the printed contour, a maximum distance or a minimum surface between the printed contour and the contour of the free-form desired pattern, a minimum size of the shot prints, a minimum value of the process window at an edge of a dose profile.

2. The method of claim 1, wherein the step of determining a dose level of a shot of the second set of shots consists in subtracting from the resist threshold the dose distribution applied by the first set of shots at at least a point of said shot in the second set of shots.

3. The method of claim 1, wherein the shots in the first set of shots, which determine rounded shot prints, are not formed by a circular beam and overlap.

4. The method of claim 3, wherein the shots in the first set of shots with overlap determine rounded shot prints which overlap.

5. The method of claim 1, wherein the shots in the first set of shots, which determine rounded shot prints, are not formed by a circular beam and do not overlap.

6. The method of claim 5, wherein the shots in the first set of shots with no overlap determine rounded shot prints which overlap.

7. The method of claim 1, wherein a degree of overlap between the rounded shot prints determined by the shots in the first and second sets of shots is set at a level which is determined based on a criteria combining at least minimization of roughness of a printed contour of the shot prints and a minimization of the shot count.

8. The method of claim 7, wherein a placement and a dimension of an individual shot N in a sequence of shots in each one of said first and second sets of shots are determined based on: i) a preset degree of overlap; ii) an evaluation of an improvement of the fit criteria calculated from the N−1 previous shots due to shot N.

9. The method of one of claim 8, wherein the shots in the first set of shots, which determine rounded shot prints, are not formed by a circular beam and do not overlap, wherein the shots in the first set of shots with no overlap determine rounded shot prints which overlap, and wherein the step of determining the placement and dimension of the second set of shots comprises a sub-step of determining areas with no shot print from the first set of shots in an interior of the contour of the free-form desired pattern.

10. The method of claim 9, wherein the step of determining the placement and dimension of the second set of shots further comprises a sub-step of substantially filling the areas with no shot print with a number of at least one shot print, placement and position of which are based on an evaluation of an improvement of the fit criteria previously calculated from the N shots in the first set of shots.

11. The method of claim 1, further comprising:

a new step of determining a placement and dimension of a new second set of individual shots which each determine a rounded shot print;

a new step of determining a resist threshold to be used in a calculation of a dose level of a shot in the new second set of shots, said step of determining being based on a dose distribution resulting from applying the first set of individual shots;

wherein said new steps of determining are performed as long as the fit criteria is worse than a predetermined level.

12. The method of claim 1, further comprising a step of generating a data preparation file, said file containing the geometry and dose levels of the first set of shots and the second set of shots.

13. A non-transitory computer program implemented in a computer for generating a fracturing dataset of a surface into elementary features, said elementary features to be each exposed to at least one shot of a variable shaped beam (VSB) to transfer a free-form desired pattern onto the surface, said computer program comprising:

a module implemented by a computer and configured for determining a paving of said free-form desired pattern by a first set of individual shots which each determine a rounded shot print;

a module implemented by the computer and configured for determining a placement and dimension of a second set of individual shots which each determine a rounded shot print;

a module implemented by the computer and configured for determining a dose level of a shot in the second set of shots, said step of determining being based on a comparison between a dose distribution on the surface resulting from applying the first set of individual shots and a resist threshold;

the computer configured to determine a printed contour of shot prints from the first set of shots and the second set of shots; and the computer further configured to calculate a fit criteria between the printed contour and a contour of the free-form desired pattern, wherein the fit criteria is selected to satisfy at least one constraint in a group comprising a maximum roughness of the printed contour, a maximum distance or a minimum surface between the printed contour and the contour of the free-form desired pattern, a minimum size of the shot prints, a minimum value of the process window at an edge of a dose profile.

* * * * *